(12) United States Patent
Uchida et al.

(10) Patent No.: US 9,472,751 B2
(45) Date of Patent: Oct. 18, 2016

(54) STORAGE ELEMENT, METHOD FOR MANUFACTURING STORAGE ELEMENT, AND MEMORY

(71) Applicant: Sony Corporation, Tokyo (JP)

(72) Inventors: Hiroyuki Uchida, Kanagawa (JP);
Masanori Hosomi, Tokyo (JP);
Hiroyuki Ohmori, Kanagawa (JP);
Kazuhiro Bessho, Kanagawa (JP);
Yutaka Higo, Kanagawa (JP);
Kazutaka Yamane, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 13/922,752

(22) Filed: Jun. 20, 2013

(65) Prior Publication Data
US 2013/0302913 A1 Nov. 14, 2013

Related U.S. Application Data

(62) Division of application No. 13/163,215, filed on Jun. 17, 2011, now Pat. No. 8,598,671.

(30) Foreign Application Priority Data

Jun. 29, 2010 (JP) ................................. 2010-148219

(51) Int. Cl.
*H01L 43/12* (2006.01)
*B82Y 25/00* (2011.01)
*B82Y 40/00* (2011.01)
*G11C 11/16* (2006.01)
*H01F 10/32* (2006.01)
(Continued)

(52) U.S. Cl.
CPC ............. *H01L 43/12* (2013.01); *B82Y 25/00* (2013.01); *B82Y 40/00* (2013.01); *G11C 11/16* (2013.01); *H01F 10/3254* (2013.01); *H01F 41/307* (2013.01); *H01L 43/08* (2013.01); *H01F 10/329* (2013.01); *H01F 10/3263* (2013.01); *H01F 10/3286* (2013.01)

(58) Field of Classification Search
CPC ............................... H01L 43/02; H01L 43/08
USPC ............................................................ 438/3
See application file for complete search history.

(56) References Cited

U.S. PATENT DOCUMENTS 6,801,415 B2   10/2004  Slaughter et al.
7,349,187 B2 *  3/2008  Parkin .................. 360/324.2
(Continued)

FOREIGN PATENT DOCUMENTS

CN   101055916 A   10/2007
CN   101304038     11/2008

OTHER PUBLICATIONS

Shinji Isogami et al.; In situ heat treatment of ultrathin MgO layer for giant magnetoresistance ratio with low resistance area product in CoFeB/MgO/CoFeB magnetic tunnel junctions; Applied Physics Letters; vol. 93; 192109; 2008.
(Continued)

*Primary Examiner* — Tran Tran
(74) *Attorney, Agent, or Firm* — Dentons US LLP

(57) ABSTRACT

A method of manufacturing a storage element by forming a magnetic layer; and forming a tunnel barrier layer on the magnetic layer, wherein, n the forming a tunnel barrier layer, the tunnel barrier layer is formed to a predetermined thickness in at least two steps in a divided manner.

9 Claims, 7 Drawing Sheets

(51) Int. Cl.
*H01F 41/30* (2006.01)
*H01L 43/08* (2006.01)

(56) References Cited

U.S. PATENT DOCUMENTS

| | | | |
|---|---|---|---|
| 7,488,609 B1* | 2/2009 | Lin et al. | 365/145 |
| 2006/0126371 A1* | 6/2006 | Nagase et al. | 365/145 |
| 2008/0180859 A1 | 7/2008 | Ueda et al. | |
| 2009/0091863 A1* | 4/2009 | Hosotani et al. | 360/324.2 |
| 2010/0316890 A1* | 12/2010 | Choi et al. | 428/811.1 |

OTHER PUBLICATIONS

J. C. S. Kools and W. Kula; Effect of finite magnetic thickness on Neel coupling in spin valves; Journal of Applied Physics; vol. 85, No. 8; Apr. 15, 1999.

Chinese Office Examination Report issued in connection with related Chinese patent application No. CN 201110125939.7 dated Jul. 14, 2014.

Chinese Office Examination Report issued in connection with related Chinese Patent Application No. CN 201110125939.7 dated Mar. 3, 2015 with English translation.

* cited by examiner

STORAGE ELEMENT, METHOD FOR MANUFACTURING STORAGE ELEMENT, AND MEMORY

RELATED APPLICATION DATA

This application is a division of U.S. patent application Ser. No. 13/163,215 filed Jun. 17, 2011, the entirety of which is incorporated herein by reference to the extent permitted by law. The present application claims the benefit of priority to Japanese Patent Application No. JP 2010-148219 filed on Jun. 29, 2010 in the Japan Patent Office, the entirety of which is incorporated by reference herein to the extent permitted by law.

BACKGROUND

The present disclosure relates to a storage element with a configuration that has perpendicular magnetic anisotropy with respect to the film plane and obtains magnetoresistance change through perpendicular current application, a method for manufacturing a storage element, and a memory including this storage element.

Along with dramatic development of various kinds of information apparatus ranging from high-capacity servers to mobile terminals, further enhancement in the performance, such as increases in the degree of integration and the speed and power consumption reduction, is pursued also regarding elements such as memory and logic that configure the information apparatus. In particular, the advance of the semiconductor non-volatile memory is significant and the spread of the flash memory as a large-size file memory is progressing at such a rapid pace as to drive out the hard disk drive. On the other hand, in anticipation of expansion into the code storage and the working memory, development of ferroelectric random access memory (FeRAM), magnetic random access memory (MRAM), phase-change random access memory (PCRAM), etc. is being advanced to replace NOR flash memory, DRAM, etc., which are generally used presently. Part of these memories has been already put into practical use.

In particular, the MRAM is capable of high-speed and almost-infinite ($10^{15}$ times or more) rewriting because data is stored based on the magnetization direction of a magnetic material. The MRAM has been already used in the fields of the industrial automation, the airplane, etc. Because of its high-speed operation and high reliability, the MRAM is expected to be expanded into the code storage and the working memory in the future. However, it still has challenges in power consumption reduction and capacity increase in practice. They are essential challenges attributed to the principle of storage in the MRAM, i.e. the system in which magnetization reversal is caused by a current magnetic field generated from an interconnect.

As one method to solve this problem, studies are being made on a system of storage, i.e. magnetization reversal, that is not based on the current magnetic field. Particularly, researches relating to spin torque magnetization reversal are active. A storage element by the spin torque magnetization reversal is configured with magnetic tunnel junction (MTJ) as with the MRAM. This configuration utilizes a characteristic that spin-polarized electrons passing through a magnetic layer pinned to a certain direction give torque to another magnetic layer that is free (whose direction is not fixed) when entering this magnetic layer. In this configuration, application of a current equal to or larger than a certain threshold value causes reversal in the free magnetic layer. Rewriting of 0/1 is performed by changing the polarity of the current. The absolute value of the current for this reversal is equal to or smaller than 1 mA in an element with scale of about 0.1 µm. In addition, scaling is possible because this current value decreases in proportion to the element volume. Moreover, this system does not require the word line for generating the current magnetic field for storage, which is necessary for the MRAM, and therefore also has an advantage that the cell structure may be simpler.

Hereinafter, the MRAM utilizing the spin torque magnetization reversal will be referred to as the ST-MRAM (spin torque-magnetic random access memory). Great expectations are placed on the ST-MRAM as a non-volatile memory that enables power consumption reduction and capacity increase while keeping the MRAM's advantages that high-speed operation is possible and the number of times of rewriting is almost infinite.

To achieve power consumption reduction in the ST-MRAM, it will be important to lower the resistance of the MTJ element by decreasing the thickness of the tunnel barrier layer. If the size of the element is reduced for capacity increase in accordance with scaling, the resistance due to the tunnel barrier layer increases. Thus, decreasing the resistance of the element is difficult. Therefore, the thickness of the tunnel barrier layer should be decreased in order to achieve both of scaling and power consumption reduction.

FIG. 11 is a schematic sectional view of the MTJ structure of an ST-MRAM. The ST-MRAM shown in FIG. 11 is composed of a base layer 51, an antiferromagnetic layer 52, a magnetization pinned layer (pinned layer, reference layer) 53, a tunnel barrier layer 54, a storage layer (magnetization storage layer, free layer) 55, and a cap layer (protective layer) 56. The arrowheads indicate the magnetization directions of the respective magnetic layers in ST-MRAM operation. The storage layer 55 is formed of a ferromagnetic material having a magnetic moment whose direction of magnetization M55 freely changes to a direction parallel to the film plane (horizontal direction). The magnetization pinned layer 53 is formed of a ferromagnetic material having a magnetic moment whose direction of magnetization M53 is a fixed direction parallel to the film plane (horizontal direction). Information is stored based on the magnetization direction of the free magnetization layer (storage layer) having uniaxial anisotropy. Writing is performed by applying a current in a direction perpendicular to the film plane to thereby cause spin torque magnetization reversal in the storage layer.

The MTJ element has an extremely-thin tunnel barrier layer with a thickness equal to or smaller than 1 nm. Therefore, the interface of the tunnel barrier layer is sensitive to roughness and should be sufficiently flat. As a technique to planarize an MgO layer generally used as the tunnel barrier layer, e.g. a method of performing heating in a vacuum after forming an MgO film is known (refer to e.g. Isogami et al., APPLIED PHYSICS LETTERS Vol. 93, 192109 [2008] as Non-Patent Document 1).

SUMMARY

To realize a high magnetoresistance change ratio giving a large read signal in the ST-MRAM, it is preferable to use MgO oriented to the (001) direction as the tunnel barrier layer. However, the following problems exist in lowering the resistance by decreasing the thickness of the MgO tunnel barrier layer.

(1) Magnetic interlayer coupling (Neel coupling) between the magnetization free layer and the magnetization pinned layer increases due to the interface roughness of the tunnel barrier layer.

(2) The quality of the tunnel barrier layer is lowered due to introduction of a defect such as a pinhole into the tunnel barrier layer.

If the thickness of the tunnel barrier layer is decreased, magnetic Neel coupling between the magnetization pinned layer and the storage layer sandwiching the tunnel barrier layer occurs depending on the film thickness distribution of the tunnel barrier layer. For example, a report has been made about the relationship between increase in the interface roughness of the tunnel barrier layer and the occurrence of Neel coupling regarding the tunnel barrier layer formed with a small thickness (refer to e.g. Kools et al., JOURNAL OF APPLIED PHYSICS Vol. 85, 4466 [1999] as Non-Patent Document 2). Due to the Neel coupling, a leakage magnetic field is generated in the MTJ element. This causes troubles in operation without application of an external magnetic field. Furthermore, the magnitude of the necessary current varies from element to element.

As a result, the element characteristics including the tunnel magnetic resistance (TMR) ratio, short-circuiting, etc. are deteriorated, which causes troubles such as a decrease in the read signal of the ST-MRAM in operation as the MTJ element.

This problem clearly appears also in evaluation at the wafer level. As one example, FIG. 12 shows magnetization curves of two samples fabricated in such a manner that the thickness of the tunnel barrier layer of the above-described MTJ element was set to 0.72 nm and 0.63 nm, respectively. According to evaluation of the magnetic characteristics of the MTJ structure on a wafer, in the element in which the thickness of the tunnel barrier layer was 0.63 nm, the hysteresis loop reflecting the magnetization free layer was shifted due to Neel coupling based on above-described two factors and the individual magnetizations in the layer were dispersed due to pinhole roughness. Thus, as shown in FIG. 12, the squareness of the hysteresis loop of the sample in which the thickness of the tunnel barrier layer was decreased to 0.63 nm was deteriorated compared with the sample in which the thickness of the tunnel barrier layer was set to 0.72 nm.

As described above, for power consumption reduction of the ST-MRAM, it is important to form a high-quality tunnel barrier layer that does not cause function lowering of the MTJ element due to roughness and so forth in the range of lower resistance due to reduction in the thickness of the tunnel barrier layer.

There is a need for the present disclosure to provide a storage element and a method for manufacturing a storage element each enabling power consumption reduction, and a memory including this storage element.

According to an embodiment of the present disclosure, there is provided a storage element in which information is stored in a storage layer through change in the direction of magnetization of the storage layer by applying a current in the stacking direction and injecting a spin-polarized electron. This storage element includes the storage layer configured to retain information based on the magnetization state of a magnetic material and a magnetization pinned layer configured to be provided for the storage layer with the intermediary of a tunnel barrier layer. The tunnel barrier layer has a thickness in the range from not less than or equal to 0.1 nm to not more than or equal to 0.6 nm and interface roughness less than 0.5 nm.

According to another embodiment of the present disclosure, there is provided a memory including the above-described storage element and an interconnect configured to supply a current in the stacking direction to this storage element.

According to the storage element and the memory of the embodiments of the present disclosure, the resistance can be decreased by setting the thickness of the tunnel barrier layer to a thickness in the range from not less than or equal to 0.1 nm to not more than or equal to 0.6 nm. Furthermore, by setting the interface roughness less than 0.5 nm, Neel coupling and defects can be suppressed even when the thickness of the tunnel barrier layer is decreased to not more than or equal to 0.6 nm.

Therefore, the power consumption of the storage element and the memory can be reduced without causing quality lowering of the tunnel barrier layer.

According to another embodiment of the present disclosure, there is provided a method for manufacturing a storage element. This method includes forming a magnetic layer and forming a tunnel barrier layer on the magnetic layer. In the forming a tunnel barrier layer, the tunnel barrier layer is formed to a predetermined thickness in at least two steps in a divided manner.

In the method for manufacturing a storage element according to this embodiment of the present disclosure, in the step of forming the tunnel barrier layer, the tunnel barrier layer is formed to a predetermined thickness in such a manner that the step is divided into at least two steps in forming the whole tunnel barrier layer. By thus carrying out the forming step of the tunnel barrier layer in at least two steps in a divided manner, the tunnel barrier layer having sufficient flatness is obtained. Therefore, quality lowering of the storage element due to increase in the roughness of the tunnel barrier layer can be suppressed and the storage element enabling power consumption reduction can be manufactured.

The embodiments of the present disclosure can provide a storage element and a memory that enable power consumption reduction.

DETAILED DESCRIPTION OF THE PREFERRED EMBODIMENTS

Mode examples for carrying out the present disclosure will be described below. However, the present disclosure is not limited to the following examples.

The order of the description is as follows.
1. First Embodiment of the Present Disclosure
2. Method for Manufacturing Storage Element According to Embodiment of the Present Disclosure
3. Experimental Example of Storage Element of First Embodiment
4. Second Embodiment of the Present Disclosure
5. Experimental Example of Storage Element of Second Embodiment
6. Third Embodiment of the Present Disclosure
7. Experimental Example of Storage Element of Third Embodiment

1. First Embodiment of the Present Disclosure

Configuration Example of Memory

Figure 1:
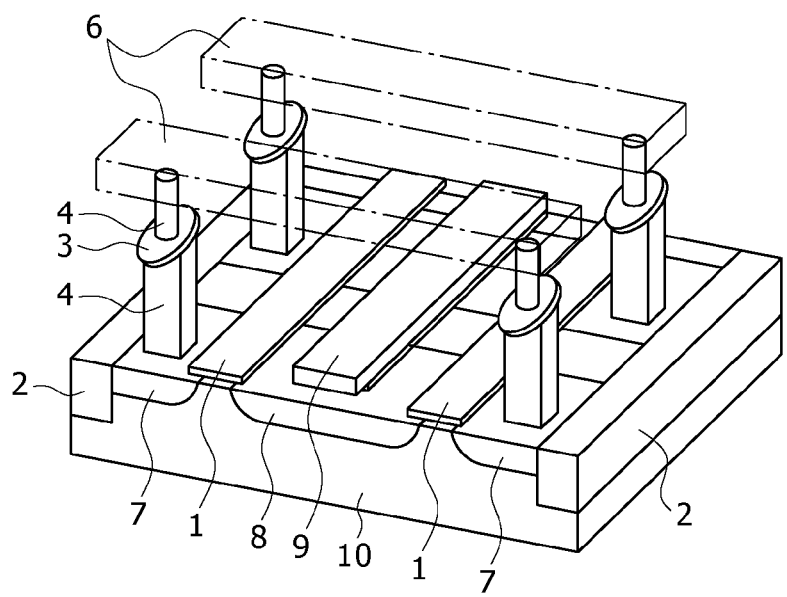
FIG. 1 is a schematic configuration diagram (perspective view) of a memory according to an embodiment of the present disclosure.

FIG. 1 is a schematic configuration diagram (perspective view) of a memory according to a first embodiment of the present disclosure.

This memory is formed by disposing storage elements capable of retaining information based on the magnetization state near the intersections of two kinds of address interconnects (e.g. word line and bit line) orthogonal to each other.

Specifically, in part isolated by an element isolating layer 2 in a semiconductor substrate 10 such as a silicon substrate, a drain region 8, a source region 7, and a gate electrode 1 are formed as a selection transistor for selecting the corresponding memory cell. The gate electrode 1 serves also as one address interconnect (e.g. word line) extended along the anteroposterior direction in the diagram.

The drain region 8 is formed in common to the selection transistors on the left and right sides in the diagram. An interconnect 9 is connected to this drain region 8.

A storage element 3 is disposed between the source region 7 and the other address interconnect (e.g. bit line) 6 that is disposed on the upper side and extended along the horizontal direction in the diagram. This storage element 3 has a storage layer formed of a ferromagnetic layer whose magnetization direction is reversed by spin injection.

This storage element 3 is disposed near the intersection of two kinds of address interconnects 1 and 6.

This storage element 3 is connected to the bit line 6 and the source region 7 via upper and lower contact layers 4, respectively.

This can supply a current to the storage element 3 via two kinds of address interconnects 1 and 6. Furthermore, by applying a current in the vertical direction (stacking direction of the storage element 3) to the storage element 3, the magnetization direction of the storage layer can be reversed by spin injection.

Configuration Example of Storage Element

Figure 2:
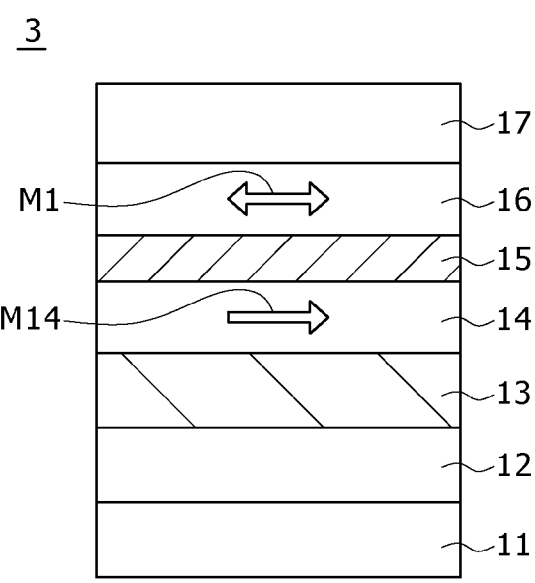
FIG. 2 is a sectional view of a storage element according to a first embodiment of the present disclosure.

FIG. 2 is a sectional view of the storage element 3 of the first embodiment.

As shown in FIG. 2, this storage element 3 has a multilayer structure obtained by sequentially stacking the following layers over a substrate 11: a base layer 12, an antiferromagnetic layer 13, a magnetization pinned layer (reference layer) 14, a tunnel barrier layer 15, a storage layer (magnetization free layer, free layer) 16, and a cap layer (protective layer) 17. Furthermore, an upper electrode (not shown) is provided over the cap layer 17 and a lower electrode (not shown) is provided at the bottom part of the base layer 12. In addition, an interconnect connected to the bit line is provided on the upper electrode, so that the storage element 3 is configured.

In the storage element 3, information is stored based on the direction of magnetization M1 of the storage layer 16 having uniaxial anisotropy. Furthermore, writing is performed by applying a current in a direction perpendicular to the film plane to thereby cause spin torque magnetization reversal in the storage layer.

The magnetization pinned layer 14 is provided below the storage layer 16, in which the direction of the magnetization M1 is reversed by spin injection. The antiferromagnetic layer 13 is provided under the magnetization pinned layer 14 and the direction of magnetization M14 of the magnetization pinned layer 14 is fixed by this antiferromagnetic layer 13. The tunnel barrier layer 15 is provided between the storage layer 16 and the magnetization pinned layer 14 and an MTJ element is configured by the storage layer 16 and the magnetization pinned layer 14.

The magnetization pinned layer 14 may be formed of only a ferromagnetic layer or may have such a configuration that its magnetization direction is fixed through utilization of antiferromagnetic coupling between an antiferromagnetic layer and a ferromagnetic layer. The magnetization pinned layer 14 has a configuration formed of a ferromagnetic layer as a single layer or a synthetic ferrimagnetic structure obtained by stacking plural ferromagnetic layers with the intermediary of a tunnel barrier layer.

If the magnetization pinned layer 14 with a synthetic ferrimagnetic structure is employed, the sensitivity of the magnetization pinned layer to an external magnetic field can be lowered. Thus, unnecessary magnetization variation of the magnetization pinned layer due to an external magnetic field can be suppressed and the storage element can be stably operated. In addition, the thicknesses of the respective ferromagnetic layers can be adjusted and the leakage magnetic field from the magnetization pinned layer can be suppressed.

Because the magnetization reversal current of the magnetization pinned layer 14 should be larger than that of the storage layer 16, the thickness of the magnetization pinned layer 14 should be set larger than that of the storage layer 16. The magnetization pinned layer 14 is formed with a thickness of e.g. 1 nm to 40 nm, which gives sufficiently-large difference as the reversal current difference from the storage layer 16.

As the material of the ferromagnetic layer configuring the magnetization pinned layer 14, e.g. Co, CoFe, and CoFeB can be used. As the material of the tunnel barrier layer to form a synthetic ferrimagnetic structure, e.g. Ru, Re, Ir, Os, or an alloy of these materials can be used.

Examples of the material of the antiferromagnetic layer 13 include magnetic materials such as FeMn alloy, PtMn alloy, PtCrMn alloy, NiMn alloy, IrMn alloy, NiO, and $Fe_2O_3$. Furthermore, the magnetic characteristics may be adjusted by adding, to these magnetic materials, non-magnetic elements such as Ag, Cu, Au, Al, Si, Bi, Ta, B, C, O, N, Pd, Pt, Zr, Hf, Ir, W, Mo, and Nb. In addition, various kinds of other properties such as the crystalline structure, the crystallinity, and the substance stability may be adjusted. The antiferromagnetic layer 13 is formed with a thickness of e.g. 1 nm to 40 nm.

As the stacking structure of the storage element 3, the storage layer 16 may be disposed on the upper side of the magnetization pinned layer 14 or may be disposed on the lower side.

The storage layer 16 is composed mainly of a ferromagnetic material such as Co, Fe, Ni, and Gd and is formed as one layer or in a multilayer state by at least two layers in such a manner that an alloy of at least two kinds of elements among these elements is used for one layer. An alloy element may be added to the respective ferromagnetic layers for control of the magnetic characteristics such as the saturation magnetization and the crystalline structure (crystalline state, microcrystalline structure, amorphous structure). For example, it is possible to use a material that is composed mainly of a CoFe alloy, a CoFeB alloy, an Fe alloy, or a NiFe alloy and doped with a magnetic element such as Gd or one or plural kinds of other elements such as B, C, N, Si, P, Al, Ti, Ta, Mo, Cr, Nb, Cu, Zr, W, V, Hf, Mn, and Pd. Alternatively, for example, it is possible to use an amorphous material obtained by doping Co with at least one kind of element selected from Zr, Hf, Nb, Ta, and Ti, or a Heusler material such as CoMnSi, CoMnAl, or CoCrFeAl. No trouble occurs in the operation of the storage element as long as the thickness of the storage layer 16 is in the range from 2 nm to 8 nm.

The cap layer 17 is composed of e.g. at least one element among Li, Be, Na, Mg, Nb, Ti, V, Ta, and Ba, or an oxide containing any of these elements, or a nitride of at least one element of Ti and V.

The base layer 12 is composed of e.g. at least one element among Mg, Ca, V, Nb, Mn, Fe, Co, and Ni, or an oxide containing any of these elements. The base layer 12 is formed with a thickness of 3 to 30 nm because too large thickness lowers the smoothness and too small thickness causes failure in the functioning.

Magnesium oxide (MgO) can be used as the material of the tunnel barrier layer 15 between the storage layer 16 and the magnetization pinned layer 14. Besides magnesium oxide, e.g. the following various kinds of insulators, dielectrics, and semiconductors can also be used: aluminum oxide, aluminum nitride, $SiO_2$, $Bi_2O_3$, $MgF_2$, CaF, $SrTiO_2$, $AlLaO_3$, and Al—N—O. To realize a high magnetoresistance change ratio giving a large read signal in the storage element 3, it is preferable to use MgO oriented to the (001) direction as the tunnel barrier layer 15.

The tunnel barrier layer 15 has a thickness in the range from not less than or equal to 0.1 nm to not more than or equal to 0.6 nm and interface roughness less than 0.5 nm.

By forming the thin tunnel barrier layer with a thickness not more than or equal to 0.6 nm, the resistance of the element can be decreased. Furthermore, by setting the interface roughness less than 0.5 nm, Neel coupling can be suppressed and increase in the driving current can be suppressed. The lower limit of the thickness of the tunnel barrier layer is set to the minimum thickness that permits the tunnel barrier layer to actually function as a tunnel insulating film, e.g. to 0.1 nm, depending on the material used. For example, if the tunnel barrier layer is formed by MgO, because the length of one unit cell of the MgO crystal is 0.42 nm, it is preferable that the thickness lower limit be set not less than or equal to about 0.3 nm, with which the tunnel barrier layer will actually function as a tunnel insulating film, based on this length of one unit cell. Furthermore, by setting the interface roughness less than 0.5 nm, introduction of a defect such as a pinhole into the tunnel barrier layer is suppressed. A layer excellent in the flatness and the crystallinity is obtained by precisely forming the tunnel barrier layer so that its roughness may be less than 0.5 nm. This can solve problems of a defect and so forth occurring in reduction in the thickness of the tunnel barrier layer in the related art.

2. Method for Manufacturing Storage Element According to Embodiment of the Present Disclosure A method for manufacturing the above-described storage element according to an embodiment of the present disclosure will be described below.

The storage element 3 of the present embodiment can be manufactured by continuously forming the layers from the base layer 12 to the cap layer 17 in vacuum apparatus by using sputtering, vacuum evaporation, CVD, PVD, etc. and then forming the pattern of the storage element 3 by processing such as etching.

First, the base layer 12 is formed on the substrate 11. As the substrate 11, e.g. a silicon substrate with a thermally-oxidized layer is used. On the substrate 11, e.g. a Ta layer is formed to a thickness of 3 nm to 30 nm as the base layer 12.

Next, the antiferromagnetic layer 13 is formed on the base layer 12. The antiferromagnetic layer 13 is formed to a thickness of 1 nm to 40 nm on the base layer 12 by using the above-described material, e.g. PtMn.

Subsequently, the magnetization pinned layer 14 is formed on the antiferromagnetic layer 13. The magnetization pinned layer 14 is formed to a thickness of 1 nm to 40 nm by using the above-described ferromagnetic layer material. If the magnetization pinned layer 14 having a synthetic ferrimagnetic structure is used, the above-described tunnel barrier layer is formed to a thickness of e.g. 0.4 nm to 2.5 nm.

Next, the tunnel barrier layer 15 is formed on the magnetization pinned layer 14. The tunnel barrier layer 15 is formed to a thickness of 0.1 nm to 0.6 nm by sputtering with use of a target of an oxide or nitride of the above-described element, e.g. MgO. As the tunnel barrier layer 15, a multilayer body composed of the above-described element and an oxide or nitride of the above-described element is formed. Specifically, e.g. an MgO/Mg multilayer body or an Mg/MgO/Mg multilayer body, which is a multilayer body composed of Mg and MgO, is formed.

Furthermore, the tunnel barrier layer 15 is formed to a predetermined thickness in such a manner that the stacking step thereof is divided into at least two steps in the forming for the thickness of the whole tunnel barrier layer 15. For example, if the tunnel barrier layer 15 is formed in two steps in a divided manner, a first tunnel barrier layer having a thickness smaller than the predetermined thickness of the tunnel barrier layer 15 is formed on the magnetization pinned layer 14 as a first step. Subsequently, in a second step, a second tunnel barrier layer is further formed by using the same material on the first tunnel barrier layer formed in the first step. By these two steps, the tunnel barrier layer 15 having the predetermined thickness is formed.

Setting the thickness of the whole tunnel barrier layer 15 equal to or smaller than 0.6 nm enables resistance decrease and power consumption reduction of the storage element. Furthermore, by dividing the forming step of the tunnel barrier layer 15 into two steps, the interface roughness of the tunnel barrier layer can be set less than 0.5 nm. This may be because, due to the forming of the tunnel barrier layer 15 in several steps in a divided manner, the rearrangement of elements attributed to surplus heat of the film deposition occurs in the intermission of the film forming treatment.

Next, the storage layer 16 is formed on the tunnel barrier layer 15. The storage layer 16 is formed to a thickness of 2 nm to 8 nm by sputtering with use of the above-described ferromagnetic material. Subsequently, the cap layer 17 is formed on the storage layer 16. The cap layer 17 is formed by using the above-described element or an oxide or nitride of the above-described element.

Through the above-described steps, the storage element 3 having the configuration shown in FIG. 2 can be manufactured.

Modification Example of Storage Element: Magnetization Perpendicular to Film Plane The above-described first embodiment relates to a storage element including a storage layer having in-plane magnetic anisotropy. However, the embodiment of the present disclosure can be applied also to a storage element having perpendicular magnetic anisotropy with respect to the film plane.

Figure 3:
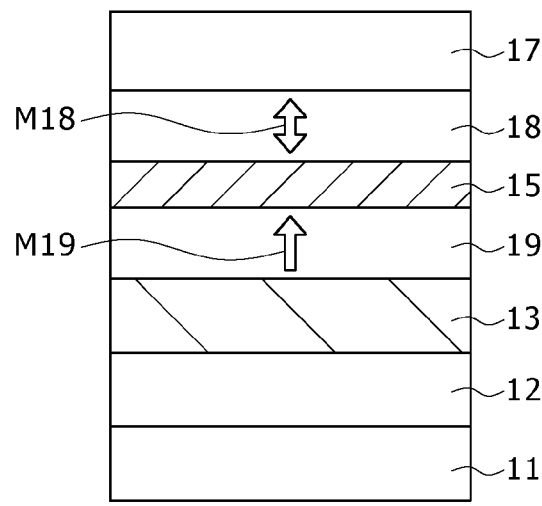
FIG. 3 is a sectional view of a storage element according to another embodiment of the present disclosure.

FIG. 3 is a schematic sectional view of an ST-MRAM of the perpendicular magnetization type. The ST-MRAM has a multilayer structure obtained by sequentially stacking the following layers over the substrate 11: the base layer 12 for crystal orientation, the antiferromagnetic layer 13, a magnetization pinned layer (reference layer) 19, the tunnel barrier layer 15, a storage layer (magnetization free layer, free layer) 18, and the cap layer 17 (protective layer). Furthermore, an upper electrode (not shown) is provided over the cap layer 17 and a lower electrode (not shown) is provided at the bottom part of the base layer 12. In addition, an interconnect connected to the bit line is provided on the upper electrode, so that the storage element is configured.

The storage layer 18 is formed of a ferromagnetic material having a magnetic moment whose direction of magnetization M18 freely changes to a direction perpendicular to the layer plane. The magnetization pinned layer 19 is formed of a ferromagnetic material having a magnetic moment whose direction of magnetization M19 is fixed to a direction perpendicular to the film plane. Information is stored based on the direction of the magnetization M18 of the storage layer 18 having uniaxial anisotropy. Writing is performed by applying a current in a direction perpendicular to the film plane to thereby cause spin torque magnetization reversal.

The magnetization pinned layer 19 is provided below the storage layer 18, in which the direction of the magnetization M18 is reversed by spin injection as just described. Furthermore, the antiferromagnetic layer 13 is provided under the magnetization pinned layer 19 and the direction of the magnetization M19 of the magnetization pinned layer 19 is fixed due to this antiferromagnetic layer 13. The tunnel barrier layer 15 is provided between the storage layer 18 and the magnetization pinned layer 19 and an MTJ element is configured by the storage layer 18 and the magnetization pinned layer 19.

The configuration of the ST-MRAM of the perpendicular magnetization type except for the magnetization pinned layer and the storage layer is the same as that of the storage element of the in-plane magnetization type. Thus, this ST-MRAM of the perpendicular magnetization type can be configured similarly to the above-described first embodiment. Therefore, description of the configuration except for the magnetization pinned layer 19 and the storage layer 18 is omitted.

The storage layer 18 is formed from a magnetic material having perpendicular magnetic anisotropy. Examples of such a magnetic material include rare earth-transition metal alloys such as TbCoFe, metal multilayer films such as a Co/Pd multilayer film, and ordered alloys such as FePt. To realize a high magnetoresistance change ratio giving a large read signal in the ST-MRAM, it is preferable to use MgO as the tunnel barrier layer 15. In view of this point, it is preferable to use FePt, FePd, FeNi, and MnAl alloy oriented to the (001) plane.

As the magnetization pinned layer 19, a magnetic layer whose reversal current is large is used. By using a magnetic layer whose reversal current is larger than that of the storage layer 18, a high-performance storage element can be configured.

As the material of the magnetization pinned layer 19. e.g. an alloy that is composed mainly of Co and contains at least one element among Cr, Ta, Nb, V, W, Hf, Ti, Zr, Pt, Pd, Fe, and Ni can be used. For example, CoCr, CoPt, CoCrTa, and CoCrPt can be used. Alternatively, an amorphous alloy composed of Tb, Dy, or Gd and a transition metal can be used. For example, TbFe, TbCo, and TbFeCo can be used.

The magnetization pinned layer 19 may be formed of only a ferromagnetic layer or may have a synthetic ferrimagnetic structure obtained by stacking plural ferromagnetic layers with the intermediary of a tunnel barrier layer.

Also in the ST-MRAM having perpendicular magnetization, the tunnel barrier layer is so formed as to have a thickness in the range from not less than or equal to 0.1 nm to not more than or equal to 0.6 nm and interface roughness less than 0.5 nm in such a manner that the stacking step thereof is divided into at least two steps. In the present embodiment, it is preferable to use MgO oriented to the (001) plane as the tunnel barrier layer.

In general, it is considered that the storage element having perpendicular magnetic anisotropy is more suitable for power reduction and capacity increase than the storage element having in-plane magnetic anisotropy. This is because the energy barrier that should be surpassed in spin torque magnetization reversal is lower for perpendicular magnetization and high magnetic anisotropy possessed by the perpendicular magnetization film is advantageous to keep the thermal stability of the storage carrier microminiaturized for capacity increase.

3. Experimental Example of Storage Element of First Embodiment

An MTJ element was actually configured based on the configuration of the storage element of the embodiment of the present disclosure, and its characteristics were investigated.

Comparison of Magnetization Characteristics

Experimental Example 1

A 5-nm-thick Ta layer was formed as the base layer 12 on a silicon substrate with a thermally-oxidized film. Next, a 20-nm-thick PtMn layer was formed as the antiferromagnetic layer 13, and 2-nm-thick CoFe/0.8-nm-thick Ru/2-nm-thick CoFeB layers were sequentially formed as the magnetization pinned layer 14. In this example, a spin valve structure made by utilizing the antiferromagnetic layer 13 was used, and a synthetic ferrimagnetic structure made with the intermediary of Ru was used as the structure of the magnetization pinned layer 14.

Next, as the tunnel barrier layer, a 0.4-nm-thick MgO layer was formed in a first step and then a 0.07-nm-thick MgO layer for the remaining thickness was formed in a second step. At last, a 3-nm-thick CoFeB layer as the free magnetization layer and a cap layer were sequentially formed. After the multilayer body having the above-described configuration was formed, magnetic field heat treatment was performed at 320° C. Through the above-described steps, an MTJ element of experimental example 1 in which the thickness of the tunnel barrier layer was 0.47 nm was fabricated.

Experimental Examples 2 to 4

MTJ elements of experimental examples 2 to 4 were fabricated by the same method as that of experimental example 1 except for that the thickness of the MgO layer formed in the second step for forming the tunnel barrier layer was set to 0.13 nm, 0.19 nm, and 0.23 nm, respectively. In the MTJ elements of experimental examples 2 to 4, the thicknesses of the tunnel barrier layer were 0.53 nm (experimental example 2), 0.59 nm (experimental example 3), and 0.63 nm (experimental example 4).
(Comparison of Magnetization Curve)

Figure 4:
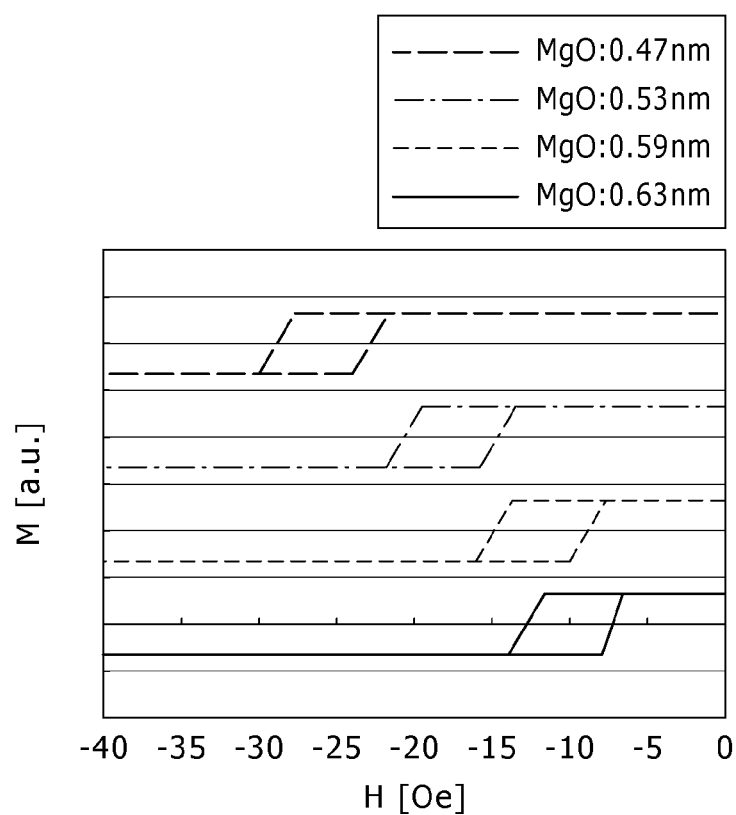
FIG. 4 is a diagram showing magnetization curves of elements of experimental examples 1 to 4.

FIG. 4 shows magnetization curves of the storage layer about the respective fabricated samples of the MTJ elements of experimental examples 1 to 4. In FIG. 4, the abscissa indicates the applied magnetic field H [Oe] and the ordinate indicates the magnetization M [a. u].

The elements of experimental examples 1 to 4 exhibited favorable squareness attributed to planarization of the tunnel barrier layer.

Figure 12:
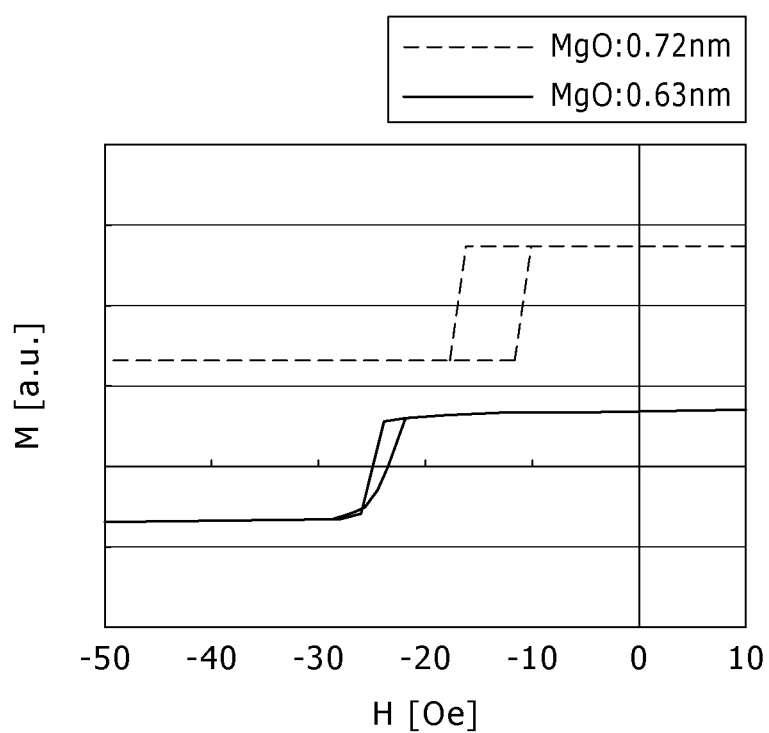
FIG. 12 is a diagram showing a magnetization curve of the related-art storage element.

In experimental example 4, in which the thickness of the tunnel barrier layer was 0.63 nm, favorable squareness attributed to planarization of the tunnel barrier layer was shown. In contrast, according to the magnetization curves (FIG. 12) of the MTJ elements formed by the related art, favorable squareness was shown when the MgO thickness was 0.72 nm but the squareness was deteriorated when the MgO thickness was 0.63 nm. From this result, it turns out that increase in the roughness did not occur in the MTJ element fabricated in experimental example 4 although the thickness of the tunnel barrier layer was set to 0.63 nm.

This is due to that quality deterioration of the tunnel barrier layer was suppressed in experimental example 4, in contrast to the related art, in which the quality of the tunnel barrier layer was lowered due to Neel coupling and pinhole roughness if the thickness of the tunnel barrier layer was decreased to 0.63 nm.

Moreover, according to the magnetization curves of experimental examples 1 to 3, favorable squareness was kept also when the MgO thickness was gradually decreased to 0.59 nm (experimental example 3), 0.53 nm (experimental example 2), and 0.47 nm (experimental example 1).

From this result, it is clear that the flatness was kept and introduction of a defect such as a pinhole was suppressed in the MTJ elements of experimental examples 1 to 4 also when the thickness of the tunnel barrier layer was decreased to 0.47 nm.

Comparison of Interface Roughness of Tunnel Barrier Layer

A description will be made below about the interface roughness of the tunnel barrier layer in the storage elements of the above-described experimental examples 1 to 4.

In the above-described Non-Patent Document 2, the following equation (1) including interface roughness h is defined regarding the correlation between Neel coupling (Hf) across the interface of the tunnel barrier layer and the thickness of the tunnel barrier layer.

[Expression 1]

$$H_f = \frac{\pi^2 h^2 Mp}{\sqrt{2}\lambda \cdot tf} \exp\left(\frac{-\pi\sqrt{2} \cdot tMgO}{\lambda}\right) \quad (1)$$

In equation (1), Mp denotes the magnetic moment of the magnetization pinned layer; tf denotes the thickness of the magnetization free layer; tMgO denotes the thickness of the tunnel barrier layer; λ denotes the uniformity in the film plane; and h denotes the interface roughness.

The interface roughness h can be evaluated by performing fitting in accordance with the above-described equation (1) about the relationship between the thickness tMgO of the tunnel barrier layer and the Neel coupling Hf in experimental examples 1 to 4. Specifically, in fabrication of the ST-MRAM, the tunnel barrier layers having different thicknesses are formed under the same manufacturing condition. Furthermore, about the plural elements having the different thicknesses of the tunnel barrier layer, the Neel coupling Hf and the thickness of the tunnel barrier layer are subjected to fitting by using the above-described equation (1). By this method, in the ST-MRAM, the interface roughness h of the tunnel insulating layer formed under this manufacturing condition can be obtained.

The Neel coupling Hf is defined as the amount of shift of the hysteresis loop of the free layer from the zero magnetic field. For the Neel coupling Hf, the amount of shift can be obtained from the magnetization curve regarding the wafer for example. As for the element, the amount of shift can be obtained from the magnetoresistance curve.

The above-described equation (1) is not an equation used exclusively for the case of using MgO as the tunnel barrier layer and can be applied to the case of a structure in which the magnetic layer is separated by a spacer. For example, this equation can be applied also to an element whose tunnel barrier layer is formed by using another material such as aluminum oxide.

Experimental Examples 5 to 8

MTJ elements of experimental examples 5 to 8 were fabricated by the same method under the same manufacturing condition as those of the above-described experimental example 1 except for that an MgO layer was fabricated in a single step for its whole thickness in the step of forming the tunnel barrier layer. In the MTJ elements of experimental examples 5 to 8, the thicknesses of the MgO layer were 0.72 nm (experimental example 5), 0.66 nm (experimental example 6), 0.63 nm (experimental example 7), and 0.59 nm (experimental example 8).

Figure 5:
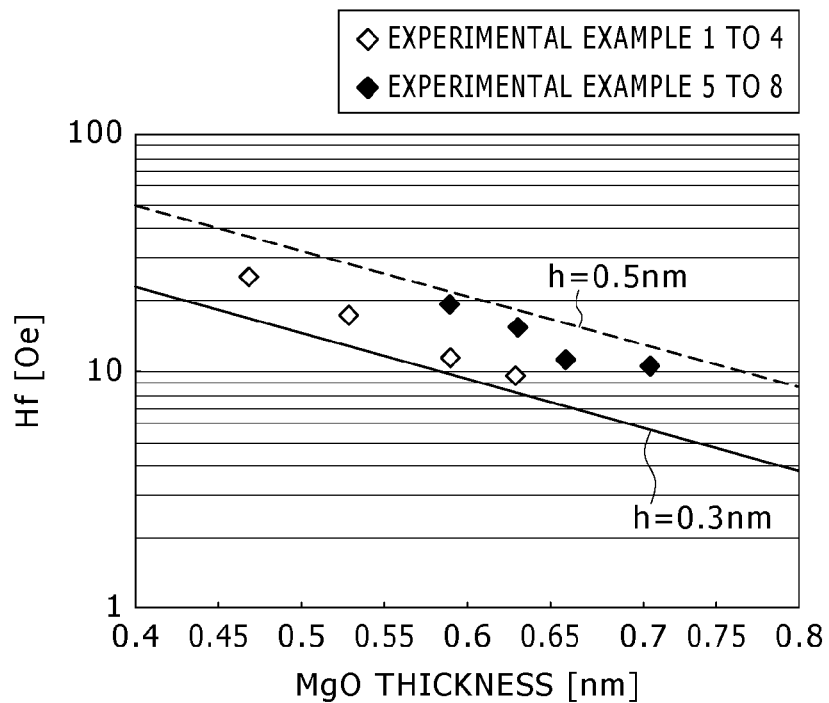
FIG. 5 is a diagram showing the interface roughness of the elements of experimental examples 1 to 4 and elements of experimental examples 5 to 8.

Regarding the MTJ elements of the above-described experimental examples 1 to 4 and the MTJ elements of experimental examples 5 to 8, the relationship between the thickness tMgO of the tunnel barrier layer and the Neel coupling Hf is shown in FIG. 5. In FIG. 5, the result of fitting of equation (1) to the MTJ elements of experimental examples 1 to 4 is indicated by the solid line, and the result of fitting of equation (1) to the MTJ elements of experimental examples 5 to 8 is indicated by the dashed line.

As the result of the fitting of equation (1) to the MTJ elements of experimental examples 1 to 4, the interface roughness h of the tunnel barrier layer in experimental examples 1 to 4 was 0.3 nm. As the result of the fitting of equation (1) to the MTJ elements of experimental examples 5 to 8, the interface roughness h of the tunnel barrier layer in experimental examples 5 to 8 was 0.5 nm.

The following conclusion is obtained from the result of this interface roughness and the result of the above-described magnetization curve. Specifically, if the interface roughness of the tunnel barrier layer is 0.5 nm, the squareness of the magnetization curve is favorable when the thickness of the tunnel barrier layer is 0.72 nm but the magnetization curve is deteriorated when the thickness is 0.63 nm. In contrast, if the interface roughness of the tunnel barrier layer is 0.3 nm, the squareness of the magnetization curve is favorable even when the thickness is not more than or equal to 0.63 nm. That is, in the ST-MRAM in which the tunnel barrier layer with a thickness not more than or equal to 0.6 nm is formed, favorable characteristics are obtained by setting the interface roughness of the tunnel barrier layer less than 0.5 nm. From the above-described results, it turns out that, by decreasing the interface roughness, quality deterioration is suppressed even when a tunnel barrier layer having a small thickness is formed.

Furthermore, a layer having high flatness can be formed as the tunnel barrier layer by stacking the layer in at least two steps in a divided manner as described above. Thus, even when the tunnel barrier layer is formed with a thickness smaller than that in the related art, Neel coupling and quality deterioration of the tunnel barrier layer in the storage element due to increase in the interface roughness can be suppressed. Furthermore, introduction of a defect such as a pinhole is suppressed by forming a precise tunnel barrier layer that has interface roughness less than 0.5 nm and is excellent in flatness and crystallinity. Thus, problems of a defect and so forth occurring in reduction in the thickness of the tunnel barrier layer in the related art can be solved. Therefore, through the reduction in the thickness of the high-quality tunnel barrier layer, the resistance can be decreased without quality deterioration of the storage element.

4. Second Embodiment of the Present Disclosure

Storage Element with Dual-Structure 1

A storage element according to a second embodiment of the present disclosure will be described below. The storage element of the second embodiment can also be applied to the storage element of the memory of the above-described first embodiment.

Figure 6:
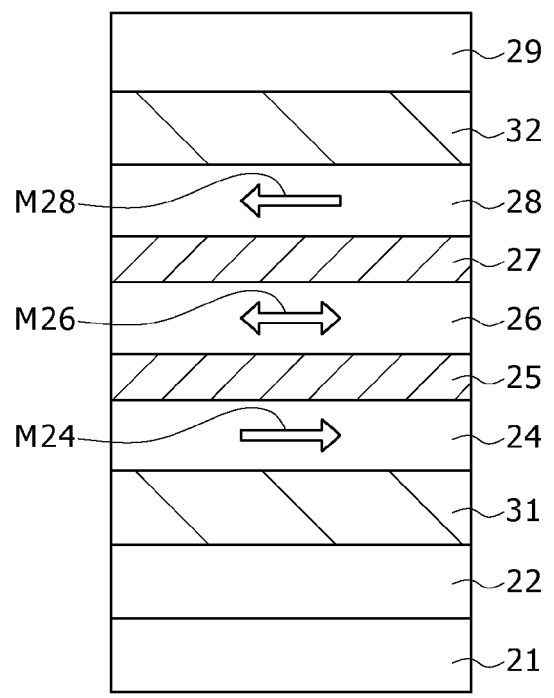
FIG. 6 is a sectional view of a storage element according to a second embodiment of the present disclosure.

FIG. 6 is a sectional view of the storage element of the second embodiment.

The storage element of the second embodiment has a multilayer structure obtained by sequentially stacking, over a substrate 21, a base layer 22, a first antiferromagnetic layer 31, a first magnetization pinned layer 24, a first tunnel barrier layer 25, and a storage layer 26. Furthermore, the storage element has a multilayer structure obtained by sequentially stacking, over the storage layer 26, a second tunnel barrier layer 27, a second magnetization pinned layer 28, a second antiferromagnetic layer 32, and a cap layer 29. Furthermore, an upper electrode (not shown) is provided over the cap layer 29 and a lower electrode (not shown) is provided at the bottom part of the base layer 22. In addition, an interconnect connected to the bit line is provided on the upper electrode, so that the storage element is configured.

As shown in FIG. 6, in this storage element, the first magnetization pinned layer 24 and the second magnetization pinned layer 28 are provided below and over, respectively, the storage layer 26 in which the direction of magnetization M26 is reversed by spin injection.

The first antiferromagnetic layer 31 is provided under the first magnetization pinned layer 24 and the direction of magnetization M24 of the first magnetization pinned layer 24 is fixed due to this first antiferromagnetic layer 31. The second antiferromagnetic layer 32 is provided on the second magnetization pinned layer 28 and the direction of magnetization M28 of the second magnetization pinned layer 28 is fixed due to this second antiferromagnetic layer 32. The first tunnel barrier layer 25 is provided between the storage layer 26 and the first magnetization pinned layer 24 and the second tunnel barrier layer 27 is provided between the storage layer 26 and the second magnetization pinned layer 28. That is, this MTJ element has a configuration in which upper and lower two magnetization pinned layers 24 and 28 are provided for the storage layer 26 (Dual-MTJ element).

The storage element of the second embodiment may have the same configuration as that of the storage element of the above-described first embodiment (Single-MTJ element) except for that the second tunnel barrier layer 27, the second magnetization pinned layer 28, and the second antiferromagnetic layer 32 are provided between the storage layer 26 and the cap layer 29.

The second magnetization pinned layer 28 may be formed of only a ferromagnetic layer or may have a synthetic ferrimagnetic structure obtained by stacking plural ferromagnetic layers with the intermediary of a tunnel barrier layer. If the second magnetization pinned layer 28 with a synthetic ferrimagnetic structure is employed, the sensitivity of the magnetization pinned layer to an external magnetic field can be lowered. Thus, unnecessary magnetization variation of the magnetization pinned layer due to an external magnetic field can be suppressed and the storage element can be stably operated. In addition, the thicknesses of the respective ferromagnetic layers can be adjusted and the leakage magnetic field from the magnetization pinned layer can be suppressed.

Because the magnetization reversal current of the second magnetization pinned layer 28 should be larger than that of the storage layer 26, the thickness of the second magnetization pinned layer 28 should be set larger than that of the storage layer 26. The second magnetization pinned layer 28 is formed with a thickness that gives sufficiently-large difference as the reversal current difference from the storage layer 26, e.g. with a thickness of 1 nm to 40 nm.

As the material of the ferromagnetic layer configuring the second magnetization pinned layer 28, e.g. Co, CoFe, and CoFeB can be used similarly to the magnetization pinned layer of the above-described first embodiment. As the material of the tunnel barrier layer to form a synthetic ferrimagnetic structure, e.g. Ru, Re, Ir, Os, or an alloy of these materials can be used.

Magnesium oxide can be used as the material of the second tunnel barrier layer 27 between the storage layer 26 and the second magnetization pinned layer 28. Besides magnesium oxide, e.g. the following various kinds of insulators, dielectrics, and semiconductors can also be used: aluminum oxide, aluminum nitride, $SiO_2$, $Bi_2O_3$, $MgF_2$, CaF, $SrTiO_2$, $AlLaO_3$, and Al—N—O.

The resistance of the element can be decrease by forming a thin layer whose thickness is not less than or equal to 0.1 nm to not more than or equal to 0.6 nm as the second tunnel barrier layer 27. In the Dual-MTJ structure, particularly in forming the second tunnel barrier layer 27, the flatness tends to be deteriorated because the underlying multilayer structure is more complex compared with the Single-MTJ structure. If the flatness of the second magnetization pinned layer 28 as the upper layer is lost, possibly the functions as the element are lost. Specifically, for example, the storage layer 26 is magnetically coupled to the second magnetization pinned layer 28 and magnetization reversal simultaneously occurs in these layers.

To avoid this problem, the interface roughness of the second tunnel barrier layer 27 is set less than 0.5 nm. By setting the interface roughness less than 0.5 nm, Neel coupling can be suppressed and increase in the driving current can be suppressed. In addition, introduction of a defect such as a pinhole into the tunnel barrier layer is suppressed by setting the interface roughness less than 0.5 nm.

The storage element of the above-described second embodiment includes the first tunnel barrier layer 25 and the second tunnel barrier layer 27 sandwiching the storage layer 26. However, it is sufficient that at least one of these tunnel barrier layers has a thickness not less than or equal to 0.1 nm to not more than or equal to 0.6 nm and interface roughness less than 0.5 nm. Satisfying the above-described condition by at least one layer can suppress quality deterioration attributed to increase in the roughness of the tunnel barrier layer and configure the storage element whose resistance can be decreased. It is particularly preferable that the second tunnel barrier layer 27 satisfy the above-described condition. Alternatively, it is preferable that both of the first tunnel barrier layer 25 and the second tunnel barrier layer 27 satisfy the above-described condition.

5. Experimental Example of Storage Element of Second Embodiment

A Dual-MTJ element was actually configured based on the configuration of the storage element of the above-described second embodiment, and its characteristics were investigated.

Magnetization Characteristics

Experimental Example 9

A 3-nm-thick Ta layer was formed as the base layer 22 on a silicon substrate with a thermally-oxidized film. Next, a 20-nm-thick PtMn layer was formed as the first antiferromagnetic layer 31, and 2-nm-thick CoFe/0.8-nm-thick Ru/4-nm-thick CoFe/0.8-nm-thick Ru/2-nm-thick CoFeB layers were sequentially formed as the first antiferromagnetic layer 31. In this example, a spin valve structure made by utilizing the first antiferromagnetic layer 31 was used, and a synthetic ferrimagnetic structure made with the intermediary of Ru was used as the structure of the first magnetization pinned layer 24.

Next, a 0.75-nm-thick MgO layer was formed as the first tunnel barrier layer 25 and then a 3-nm-thick CoFeB layer was formed as the storage layer 26. Furthermore, as the second tunnel barrier layer 27 on the storage layer 26, a 0.4-nm-thick MgO layer was formed in a first step and then a 0.19-nm-thick MgO layer for the remaining thickness was formed in a second step.

Moreover, 1-nm-thick CoFeB/2-nm-thick CoFe/0.9-nm-thick Ru/2-nm-thick CoFe layers were sequentially formed as the second magnetization pinned layer 28. In addition, a 20-nm-thick PtMn layer was formed as the second antiferromagnetic layer 32. In this example, the second magnetization pinned layer 28 was so configured as to have a structure that was a synthetic ferrimagnetic structure made with the intermediary of Ru and enabled the magnetization direction to be fixed by using the second antiferromagnetic layer 32. Furthermore, the thickness of the magnetic layer in contact with the second tunnel barrier layer 27 in the second magnetization pinned layer 28 was so adjusted that the magnetization direction of the second magnetization pinned layer 28 was antiparallel to that of the first magnetization pinned layer 24. At last, the cap layer 29 was formed. After the multilayer body having the above-described configuration was formed, magnetic field heat treatment was performed at 320° C. Through the above-described steps, a Dual-MTJ element of experimental example 9 was fabricated.

Experimental Example 10

A Dual-MTJ element of experimental example 10 was fabricated by the same method as that of the above-described experimental example 9 except for that a 0.59-nm-thick MgO layer was fabricated in a single step in the step of forming the second tunnel barrier layer.
(Magnetization Curve)

Figure 7:
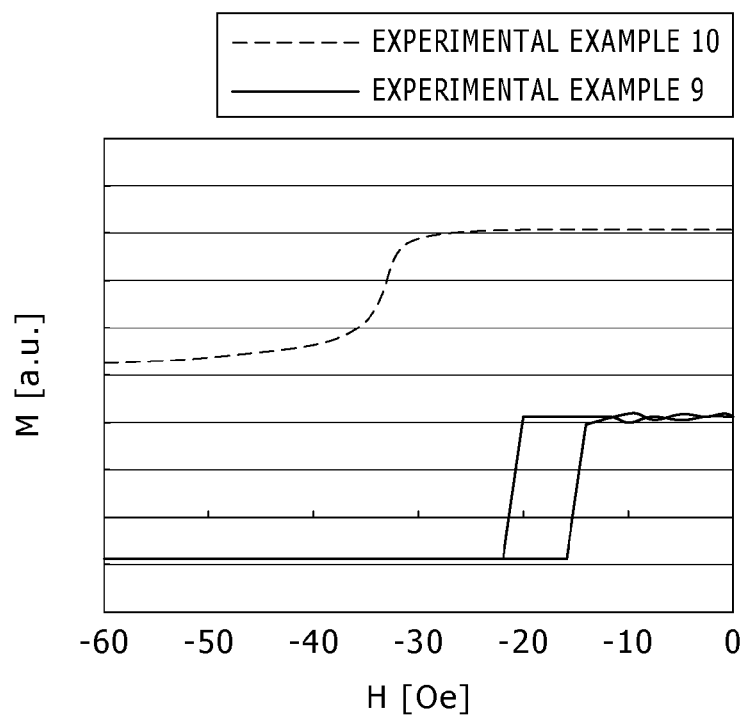
FIG. 7 is a diagram showing magnetization curves of elements of experimental example 9 and experimental example 10.

FIG. 7 shows magnetization curves of the storage layer about the fabricated Dual-MTJ elements of experimental examples 9 and 10. In FIG. 7, the abscissa indicates the applied magnetic field H [Oe] and the ordinate indicates the magnetization M [a. u]. Furthermore, in FIG. 7, the magnetization curve of experimental example 9 is shown by the solid line and the magnetization curve of experimental example 10 is shown by the dashed line.

The element of experimental example 9, in which the second tunnel barrier layer 27 was formed in two steps, exhibited favorable squareness similarly to the MTJ element of the above-described first embodiment. In contrast, experimental example 10, in which the second tunnel barrier layer was formed in a single step, showed a spoiled hysteresis loop due to quality deterioration of the second tunnel barrier layer. From this result, it turns out that, in the Dual-MTJ element of experimental example 9, the flatness of the second tunnel barrier layer was ensured and both of suppression of Neel coupling and improvement in the squareness of the hysteresis loop were achieved.

6. Third Embodiment of the Present Disclosure

Storage Element with Dual-Structure 2

A storage element according to a third embodiment of the present disclosure will be described below. The storage element of the third embodiment can also be applied to the storage element of the memory of the above-described first embodiment.

Figure 8:
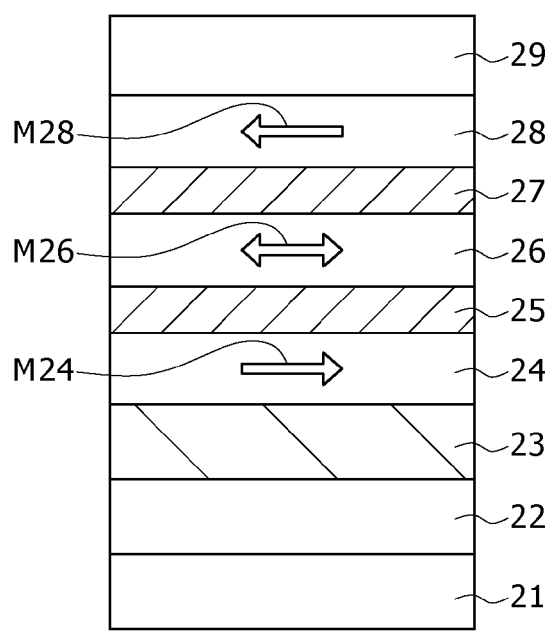
FIG. 8 is a sectional view of a storage element according to a third embodiment of the present disclosure.

FIG. 8 is a sectional view of the storage element of the third embodiment.

The storage element of the third embodiment has a multilayer structure obtained by sequentially stacking, over the substrate 21, the base layer 22, an antiferromagnetic layer 23, the first magnetization pinned layer 24, the first tunnel barrier layer 25, and the storage layer 26. Furthermore, the storage element has a multilayer structure obtained by sequentially stacking, over the storage layer 26, the second tunnel barrier layer 27, the second magnetization pinned layer 28, and the cap layer 29. Furthermore, an upper electrode (not shown) is provided over the cap layer 29 and a lower electrode (not shown) is provided at the bottom part of the base layer 22. In addition, an interconnect connected to the bit line is provided on the upper electrode, so that the storage element is configured.

As shown in FIG. 8, in this storage element, the first magnetization pinned layer 24 and the second magnetization pinned layer 28 are provided below and over, respectively, the storage layer 26 in which the direction of the magnetization M26 is reversed by spin injection. The antiferromagnetic layer 23 is provided under the first magnetization pinned layer 24 and the direction of the magnetization M24 of the first magnetization pinned layer 24 is fixed due to this antiferromagnetic layer 23. In the second magnetization pinned layer 28, the direction of the magnetization M28 is fixed to the opposite direction in the plane to that of the first magnetization pinned layer 24. The first tunnel barrier layer 25 is provided between the storage layer 26 and the first magnetization pinned layer 24 and the second tunnel barrier layer 27 is provided between the storage layer 26 and the second magnetization pinned layer 28. That is, this MTJ element has a configuration in which upper and lower two magnetization pinned layers 24 and 28 are provided for the storage layer 26 (Dual-MTJ element).

The storage element of the above-described third embodiment has a configuration obtained by removing the second antiferromagnetic layer 32 from the storage element of the second embodiment. Although the second antiferromagnetic layer is provided on the second magnetization pinned layer in the storage element of the above-described second embodiment, it is also possible to employ a configuration in which the antiferromagnetic layer is not provided on the second magnetization pinned layer as long as the magnetization direction of the second magnetization pinned layer is fixed. In the storage element of the third embodiment, the magnetization direction can be settled based on coercivity difference of the synthetic ferrimagnetic structure of the second magnetization pinned layer 28.

The storage element of the third embodiment may have the same configuration as that of the storage element of the above-described second embodiment (Dual-MTJ element) except for that the second antiferromagnetic layer is not provided between the second magnetization pinned layer 28 and the cap layer 29.

In the storage element of the above-described third embodiment, it is sufficient that at least one of the first tunnel barrier layer 25 and the second tunnel barrier layer 27 has a thickness not less than or equal to 0.1 nm to not more than or equal to 0.6 nm and interface roughness less than 0.5 nm, similarly to the storage element of the second embodiment. It is particularly preferable that the second tunnel barrier layer 27 satisfy the above-described condition. Alternatively, it is preferable that both of the first tunnel barrier layer 25 and the second tunnel barrier layer 27 satisfy the above-described condition.

7. Experimental Example of Storage Element of Third Embodiment

A Dual-MTJ element was actually configured based on the configuration of the storage element of the above-described third embodiment, and its characteristics were investigated.

Magnetization Characteristics

Experimental Example 11

A 3-nm-thick Ta layer was formed as the base layer 22 on a silicon substrate with a thermally-oxidized film. Next, a 20-nm-thick PtMn layer was formed as the antiferromagnetic layer 23, and 2-nm-thick CoFe/0.8-nm-thick Ru/4-nm-thick CoFe/0.8-nm-thick Ru/2-nm-thick CoFeB layers were sequentially formed as the first magnetization pinned layer 24. In this example, a spin valve structure made by utilizing the antiferromagnetic layer 23 was used, and a synthetic ferrimagnetic structure made with the intermediary of Ru was used as the structure of the first magnetization pinned layer 24.

Next, a 0.75-nm-thick MgO layer was formed as the first tunnel barrier layer and then a 3-nm-thick CoFeB layer was formed as the storage layer 26. Furthermore, as the second tunnel barrier layer 27 on the storage layer 26, a 0.4-nm-thick MgO layer was formed in a first step and then a 0.19-nm-thick MgO layer for the remaining thickness was formed in a second step.

Moreover, 1.5-nm-thick CoFeB/2-nm-thick CoFe/0.9-nm-thick Ru/2-nm-thick CoFe/1.5-nm-thick CoFeB layers were sequentially formed as the second magnetization pinned layer 28. In this example, a synthetic ferrimagnetic structure made with the intermediary of Ru was used as the structure of the second magnetization pinned layer 28, and the thickness of the magnetic layer in contact with the second tunnel barrier layer 27 was so adjusted that the magnetization direction of this magnetic layer was antiparallel to that of the first magnetization pinned layer based on coercivity difference. At last, the cap layer 29 was formed as a protective layer. After the multilayer body having the above-described configuration was formed, magnetic field heat treatment was performed at 320° C. Through the above-described steps, a Dual-MTJ element of experimental example 11 was fabricated.

Experimental Example 12

A Dual-MTJ element of experimental example 12 was fabricated by the same method as that of the above-described experimental example 11 except for that a 0.7-nm-thick MgO layer was fabricated in a single step in the step of forming the second tunnel barrier layer.

(Magnetization Curve)

Figure 9A:
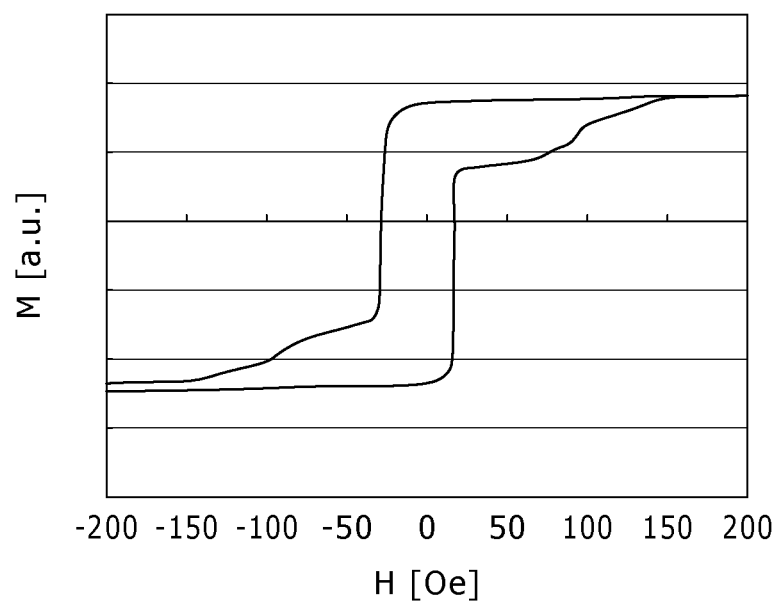
FIGS. 9A and 9B are diagrams showing magnetization curves of an element of experimental example 11.
Figure 9B:
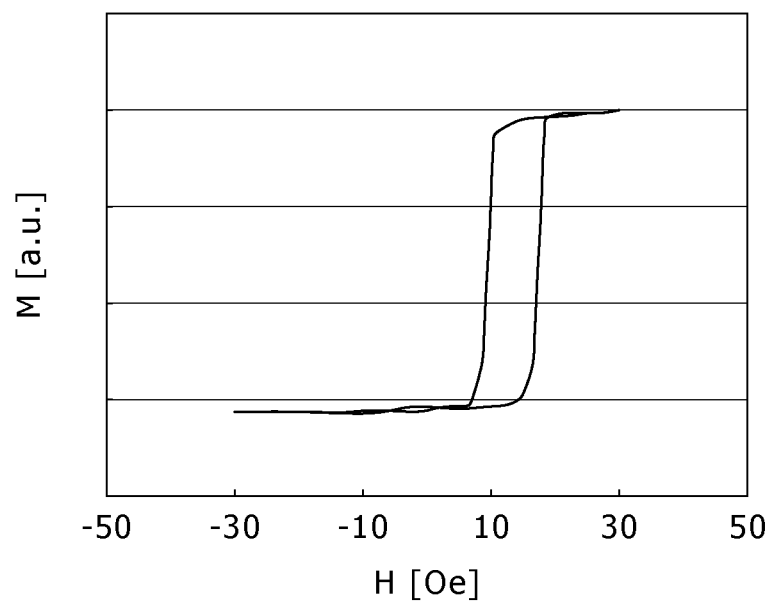
Figure 10:
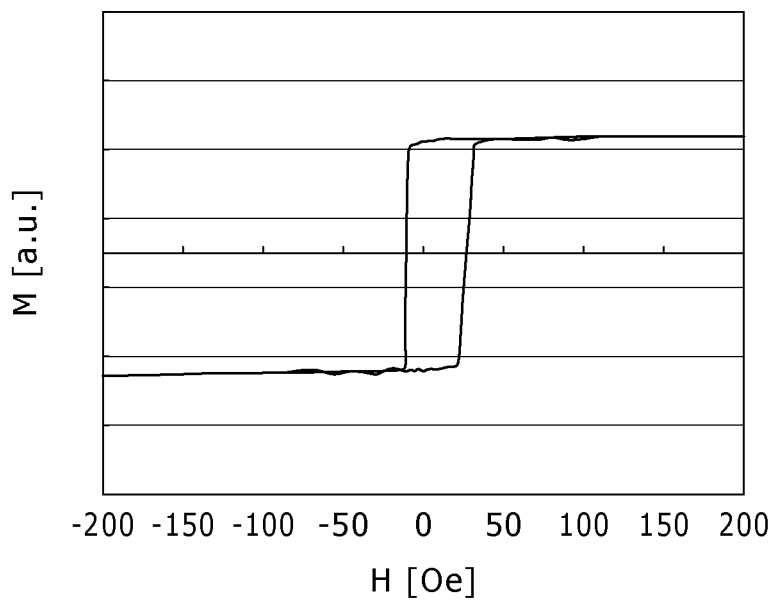
FIG. 10 is a diagram showing a magnetization curve of an element of experimental example 12.
Figure 11:
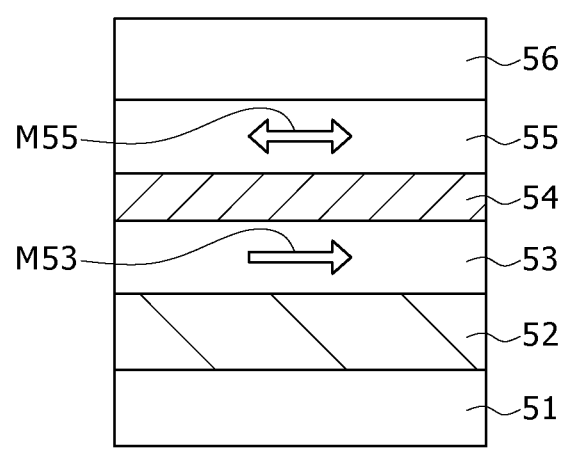
FIG. 11 is a sectional view of a related-art storage element.

FIGS. 9A and 9B show magnetization curves of the storage layer about the fabricated Dual-MTJ element of experimental example 11. FIG. 10 shows a magnetization curve of the storage layer about the fabricated Dual-MTJ element of experimental example 12. In FIGS. 9 and 10, the abscissa indicates the applied magnetic field H [Oe] and the ordinate indicates the magnetization M [a. u].

As shown in FIG. 10, the Dual-MTJ element of experimental example 12 showed behavior different from the design behavior although the thickness of the second tunnel barrier layer 27 was comparatively large, i.e. 0.7 nm. This may be because the magnetic coupling between the storage layer 26 and the second magnetization pinned layer 28 was not blocked by the second tunnel barrier layer 27 and magnetization reversal simultaneously occurred in these two layers.

This results shows that the second tunnel barrier layer 27 has larger roughness compared with the first tunnel barrier layer 25. This tendency is more pronounced in the lower resistance region, particularly when the thicknesses of the first tunnel barrier layer 25 and the second tunnel barrier layer 27 are decreased.

In contrast, in the element of experimental example 11, in which the second tunnel barrier layer 27 was formed to a thickness of 0.59 nm in two steps, as shown in FIGS. 9A and 9B, magnetic isolation between the free magnetization layer and the upper magnetization pinned layer was significantly achieved, and the existence a structure having coercivity difference could be confirmed. Furthermore, by measuring the magnetization curve in the lower magnetic field region, it was found that the hysteresis loop reflecting the free magnetization layer was obtained and the intended structure was formed.

According to this result, in the Dual-MTJ element of experimental example 11, the flatness of the second tunnel barrier layer was ensured and suppression of Neel coupling and improvement in the squareness of the hysteresis loop were achieved even when the thickness of the second tunnel barrier layer 27 was decreased.

As the storage elements having the Dual-MTJ structure according to the above-described second and third embodiments, storage elements including a storage layer having in-plane magnetic anisotropy have been described above. However, this Dual-MTJ structure can be applied also to a storage element having perpendicular magnetic anisotropy. In the case of applying this structure to a storage element having perpendicular magnetic anisotropy, the same configuration as that of the storage element based on magnetization perpendicular to the film plane, shown as the above-described modification example of the first embodiment, can be applied to the storage layer 26 and the first and second magnetization pinned layers 24 and 28. Furthermore, the storage layer 26 is formed from a ferromagnetic material having a magnetic moment whose magnetization direction freely changes to a direction perpendicular to the film plane, and the first and second magnetization pinned layers 24 and 28 are so configured as to have magnetizations fixed to directions that are perpendicular to the film plane and different from each other. By employing such a configuration, a storage element with a Dual-MTJ structure having perpendicular magnetic anisotropy can be configured.

The present disclosure is not limited to the configurations described for the above embodiment examples and other various modifications and changes can be made without departing from the configurations of the present disclosure.

The present disclosure contains subject matter related to that disclosed in Japanese Priority Patent Application JP 2010-148219 filed in the Japan Patent Office on Jun. 29, 2010, the entire content of which is hereby incorporated by reference.

What is claimed is:

1. A method of forming a memory device comprising:
    forming a first magnetic layer,
    forming, in at least two steps, a tunnel barrier layer with a thickness from 0.1 nm to 0.6 nm, both inclusive, and an interface surface roughness of less than 0.5 nm by forming a first layer with a thickness of less than 0.6 nm and then forming at least a second layer on the first layer, and
    forming a second magnetic layer,
    wherein,
        the tunnel barrier layer is sandwiched between the first and second magnetic layers,
        each of the first and second magnetic layers comprises Co—Fe—B,
        the tunnel barrier layer comprises MgO, and
        the MgO in the tunnel barrier layer is (001) oriented.

2. The method of claim 1, wherein the tunnel barrier layer is formed by sputtering using an MgO target.

3. The method of claim 1, wherein the first magnetic layer as a fixed magnetization, and the second magnetic layer has a changeable magnetization.

4. The method of claim 1 further comprising forming an antiferromagnetic layer.

5. The method of claim 3, further comprising forming an antiferromagnetic layer.

6. The method of claim 5, wherein the first magnetic layer is between the antiferromagnetic layer and the tunnel barrier layer.

7. The method of claim 5, wherein the second magnetic layer is between the antiferromagnetic layer and the tunnel barrier layer.

8. The method of claim 1, wherein the tunnel barrier layer is formed by stacking at least two layers in at least two separate layering steps.

9. The method of claim 1, wherein the tunnel barrier layer comprises (a) a layer of MgO and a layer of Mg, or (b) a layer of MgO between two layers of Mg.

* * * * *